(12) United States Patent
Hsieh et al.

(10) Patent No.: US 6,624,025 B2
(45) Date of Patent: Sep. 23, 2003

(54) METHOD WITH TRENCH SOURCE TO INCREASE THE COUPLING OF SOURCE TO FLOATING GATE IN SPLIT GATE FLASH

(75) Inventors: Chia-Ta Hsieh, Tainan (TW); Di Son Kuo, Hsinchu (TW); Chrong-Jun Lin, Hsin Tien (TW); Wen-Ting Chu, Kaoshiung (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/940,158

(22) Filed: Aug. 27, 2001

(65) Prior Publication Data

US 2003/0077868 A1 Apr. 24, 2003

(51) Int. Cl.$^7$ .................. H01L 21/336; H01L 21/425
(52) U.S. Cl. .......................... 438/258; 438/524
(58) Field of Search .................. 438/258, 524

(56) References Cited

U.S. PATENT DOCUMENTS

| | | | |
|---|---|---|---|
| 5,527,727 A | 6/1996 | Kim | 437/43 |
| 5,780,341 A | 7/1998 | Ogura | 438/259 |
| 5,970,371 A * | 10/1999 | Hsieh et al. | 438/264 |
| 6,017,793 A * | 1/2000 | Oyama | 438/258 |
| 6,017,795 A | 1/2000 | Hsieh et al. | 438/262 |
| 6,037,221 A | 3/2000 | Lee et al. | 438/257 |
| 6,051,465 A * | 4/2000 | Kato et al. | 438/258 |
| 6,124,609 A | 9/2000 | Hsieh et al. | 257/315 |
| 6,147,379 A * | 11/2000 | Hori et al. | 257/317 |
| 6,159,801 A | 12/2000 | Hsieh et al. | 438/259 |
| 6,200,858 B1 * | 3/2001 | Kokubu | 438/257 |
| 6,320,218 B1 * | 11/2001 | Furuhata | 257/315 |

* cited by examiner

*Primary Examiner*—Wael Faburyl
*Assistant Examiner*—Howard Weiss
(74) *Attorney, Agent, or Firm*—George O. Saile; Stephen B. Ackerman (57) ABSTRACT

A split-gate flash memory cell having improved programming and erasing speed with a tilted trench source, and also a method of forming the same are provided. This is accomplished by forming two floating gates and their respective control gates sharing a common source region. A trench is formed in the source region and the walls are sloped to have a tilt. A source implant is performed at a tilt angle and the trench is lined with a gate oxide layer. Subsequently, a lateral diffusion of the source implant is performed followed by thermal cycling. The lateral enlargement of the diffused source is found to increase the coupling ratio of the split-gate flash memory cell substantially.

28 Claims, 9 Drawing Sheets

METHOD WITH TRENCH SOURCE TO INCREASE THE COUPLING OF SOURCE TO FLOATING GATE IN SPLIT GATE FLASH

BACKGROUND OF THE INVENTION (1) Field of the Invention

The present invention relates to the manufacture of semiconductor memories, and in particular, directed to a split-gate flash memory having an increased coupling ratio of source to floating gate through a judicious tilt angle implanting in a trench source with tilted walls, and to a method of forming of the same.

(2) Description of the Related Art

Normally, a high degree of coupling is desired between the source and the floating gate of a split-gate flash memory cell in order to provide enhanced erasing and programming speed, as is known in the art. If the high degree of coupling is sought by higher implant energy, then the floating gate gets damaged. If, on the other hand, the increase in the coupling ratio is attempted by increasing the lateral diffusion of the implant, then the well-known problems of punch-through and junction breakdown are encountered. These problems are not unique to flat or shallow source regions only. Even with a three dimensional trench but straight walled source regions, same problems are encountered unless additional steps are taken, as disclosed later in the embodiments of the present invention.

Over the years, numerous improvements in the performance as well as in the size of memory devices have been made by varying the simple, basic one-transistor memory cell, which contains one transistor and one capacitor. The variations consist of different methods of forming capacitors, with single, double or triple layers of polysilicon, and different materials for the word and bit lines. In general, memory devices include electrically erasable and electrically programmable read-only memories (EEPROMs) of flash electrically erasable and electrically programmable read-only memories (flash EEPROMs). Many types of memory cells for EEPROMs or flash EEPROMs may have source and drains regions that are aligned to a floating gate or aligned to spacers. When the source and drain regions are aligned to the floating gate, a gate electrode for a select transistor is separate from the control gate electrode of the floating gate transistor. Separate select and control gates increase the size of the memory cell. If the source and drain regions are aligned to a spacer formed after the floating gate is formed, the floating gate typically does not overlie portions of the source and drain regions. Programming and erasing performance is degraded by the offset between the floating gate and source and drain regions.

Figure 1:
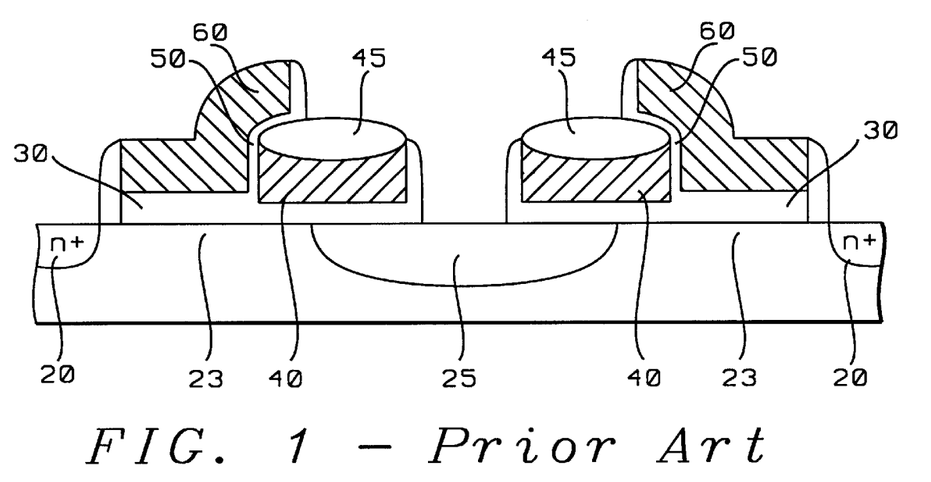
FIG. 1 is a cross-sectional view of a conventional split-gate type memory cell of prior art.

Most conventional flash-EEPROM cells use a double-polysilicon (poly) structure of which the well known split-gate cell is shown in FIG. 1. Here, two MOS transistors share a source (25). Each transistor is formed on a semiconductor substrate (10) having a first doped region (20), a second doped region (25), a channel region (23), a gate oxide (30), a floating gate (40), intergate dielectric layer (50) and control gate (60). Substrate (10) and channel region (23) have a first conductivity type, and the first (20) and second (25) doped regions have a second conductivity type that is opposite the first conductivity type.

As seen in FIG. 1, the first doped region, (20), lies within the substrate. The second doped region, (25), also lies within substrate (10) and is spaced apart form the first doped region (20). Channel region (23) lies within substrate (10) and between first (20) and second (25) doped regions. Gate oxide layer (30) overlies substrate (10). Floating gate (40), to which there is no direct electrical connection, and which overlies substrate (10), is separated from substrate (10) by a thin layer of gate oxide (30) while control gate (60), to which there is direct electrical connection, is generally positioned over the floating gate with intergate oxide (50) therebetween.

In prior art, different methods for increasing the coupling between the source and the floating gate are taught. In U.S. Pat. No. 6,159,801, Hsieh, et al., disclose a three-dimensional source capable of three-dimensional coupling with the floating gate of a split-gate flash memory cell. This is accomplished by first forming an isolation trench, lining it with a conformal oxide, then filling with an isolation oxide and then etching the latter to form a three-dimensional coupling region in the upper portion of the trench. A floating gate is next formed by first filling the three-dimensional region of the trench with polysilicon and etching it. The control gate is formed over the floating gate with an intervening inter-poly oxide. The floating gate forms legs extending into the three-dimensional coupling region of the trench thereby providing a three-dimensional coupling with the source which also assumes a three-dimensional region. The leg or the side-wall of the floating gate forming the third dimension provides the extra area through which coupling between the source and the floating gate is increased. In U.S. Pat. Nos. 6,017,795 and 6,124,609, Hsieh, et al., propose a different split-gate flash memory cell with increased coupling ratio, and the making of the same. Here, the source line is formed in a trench in a substrate over a source region. The trench walls provide the increase source in the coupling.

Kim of U.S. Pat. No. 5,527,727, on the other hand, discloses a method of manufacturing a split-gate EEPROM cell where an active region is defined to include a source bit line and a drain bit line region. A first polysilicon layer is etched through a floating gate mask until a silicon substrate in the source bit line region and the drain bit line region is exposed. A buried N+ layer is formed in the exposed silicon substrate by implanting impurity ions. A thick oxide film is formed on the buried N+ layer by a subsequent oxidation process, and this thick oxide film is etched to a constant thickness by a self-aligned etching process for forming a float gate. Thereafter, a select gate oxide film and a select gate are formed by a general process. Thus, the electrical characteristics of the cell is enhanced by decreasing the topology generated by the oxide film formed in a bit line containing a source region and a drain region, and a bit line is formed containing a source region and a drain region by performing the buried N+ impurity ion implantation process only once.

In addition, fabrication of a non-volatile memory is described by Lee, et al., in U.S. Pat. No. 6,037,221 while Ogura describes the making of a non-volatile random access memory in U.S. Pat. No. 5,780,341.

The present invention discloses still a different method of forming a split-gate flash memory device characterized by a split-gate side (between the control gate and the drain), a stacked-side (between the floating gate and the source) and by a coupling ratio between the floating gate and the source. As is stated earlier, the coupling ratio affects the program speed, that is, the larger the coupling ratio, the faster is the programming speed, and is not a fixed value by virtue of the variability of the channel length and hence that of the overlap between the floating gate and the source. Usually, if channel length is increased through greater lateral diffusion in the source region, punchthrough occurs due to excessive current well below the threshold voltage. It is shown later in the embodiments of the present invention that the coupling ratio can be increased by incorporating a judicious tilt angle implant in a trench source having tilted walls, thus alleviating the punchthrough and junction break-down of the source region.

SUMMARY OF THE INVENTION

It is therefore an object of the present invention to provide a method of forming a split-gate flash memory with a trench source having an increased coupling to the floating gate.

It is still another object of this invention to provide a method of forming a trench having tilted walls for increased coupling of the source to the floating gate of a split-gate flash memory cell.

It is yet another object of the present invention to provide a split-gate flash memory cell with a trench source having an increased coupling to the floating gate.

It is an overall object of this invention to provide a split-gate flash memory cell having improved programming and erasing speed with a trench source, and also a method of forming the same.

These objects are accomplished by providing a substrate having active and passive regions defined; forming a first gate oxide layer over said substrate; forming a first polysilicon layer over said gate oxide layer; forming a nitride layer over said first polysilicon layer; patterning said nitride layer to expose a portion of said first polysilicon layer to define a floating gate area; performing oxidation of said portion of said first polysilicon layer to form a polyoxide layer over said first polysilicon layer; etching said first polysilicon layer using said polyoxide layer as a hard mask to form a floating gate; forming an interpoly oxide over said polyoxide; forming a second polysilicon layer over said interpoly oxide; patterning said second polysilicon layer to form a control gate; forming a trench source in said substrate; performing a source implant; forming a second gate oxide layer over the inside walls of said trench source; performing a lateral diffusion of said source implant; and performing thermal cycle of said substrate.

These objects are further accomplished by providing a substrate having a source region; a split-gate flash memory cell on said substrate; a trench source in said source region; a gate oxide layer over the inside walls of said trench source; and a laterally enlarged diffused area of said source region.

BRIEF DESCRIPTION OF THE DRAWINGS

FIGS. 3a–3i correspond to the top views of FIGS. 2a–2i showing the cross-sections of the substrate of the present invention, specifically:

DESCRIPTION OF THE PREFERRED EMBODIMENTS

Referring now to the drawings, specifically to FIGS. FIGS. 2a–2i, and FIGS. 3a–3i, there is shown a method of forming a split-gate flash memory cell having improved programming and erasing speed with a tilted trench source, and also a structure thereof. FIGS. 2a–2i show a top view of a semiconductor substrate at different steps of the process, while FIGS. 3a–3i show the cross-sectional views of the substrate at the corresponding steps.

Figure 2A:
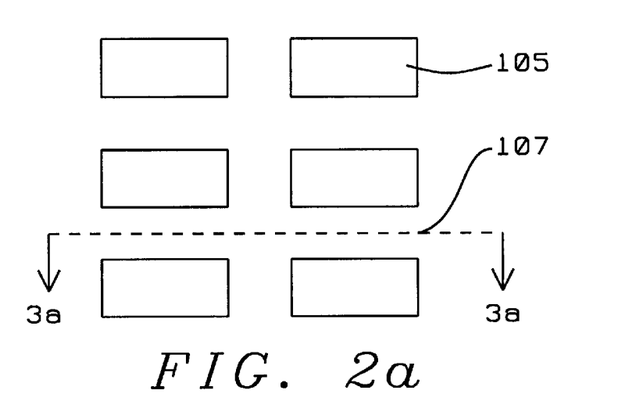
FIGS. 2a–2i are top views of a substrate showing the forming of a split-gate flash memory cell of this invention having a trench source with improved coupling to the floating gate.
Figure 3A:
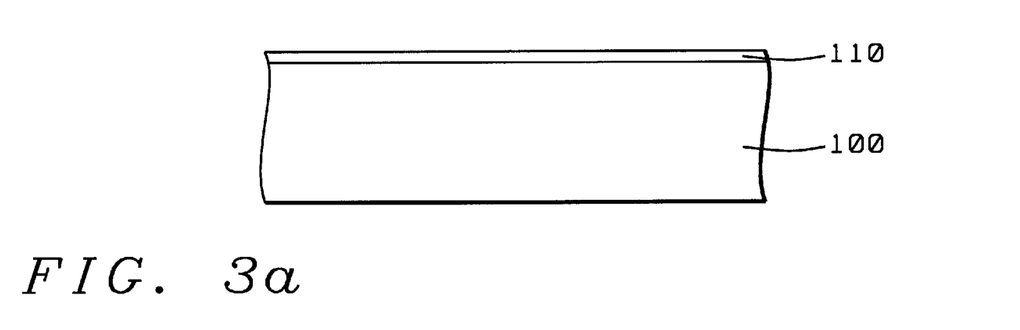
FIG. 3a is a cross-sectional view of the substrate of FIG. 2a showing the forming of first gate oxide layer, according to the present invention.

Thus, FIG. 2a shows a top view of a semiconductor substrate (100) where active regions (107) and field regions (105) have been defined. A cross-section through an active region is shown in FIG. 3a. First, a layer of gate oxide (110), better seen in the cross-sectional view, is formed over the substrate. This first gate oxide layer may be formed by using chemical vapor deposition (CVD) $SiO_2$, or grown thermally. It is preferred that layer (110) is grown thermally at a temperature between about 800 to 950° C., and to a thickness between about 70 to 90 angstroms (Å)

Figure 2B:
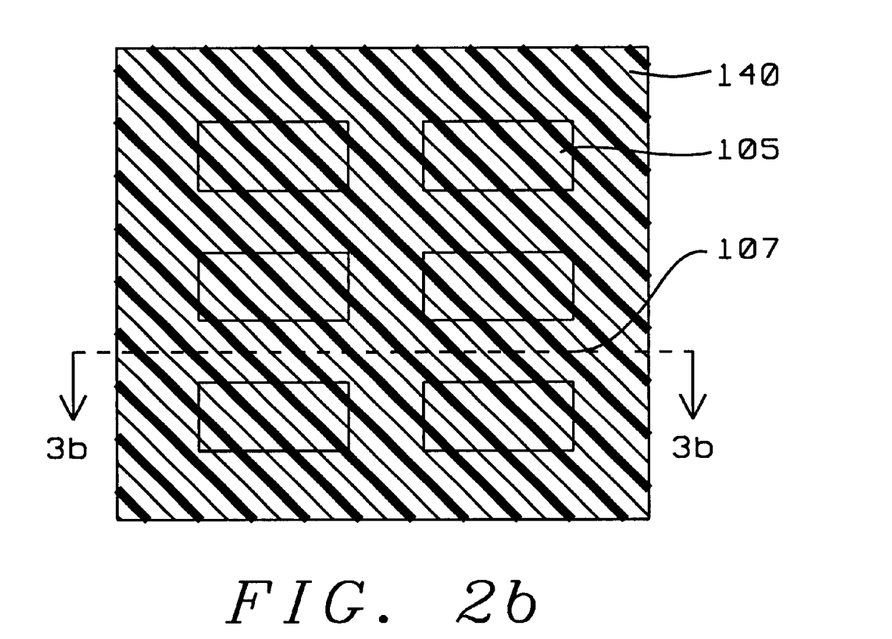
Figure 2C:
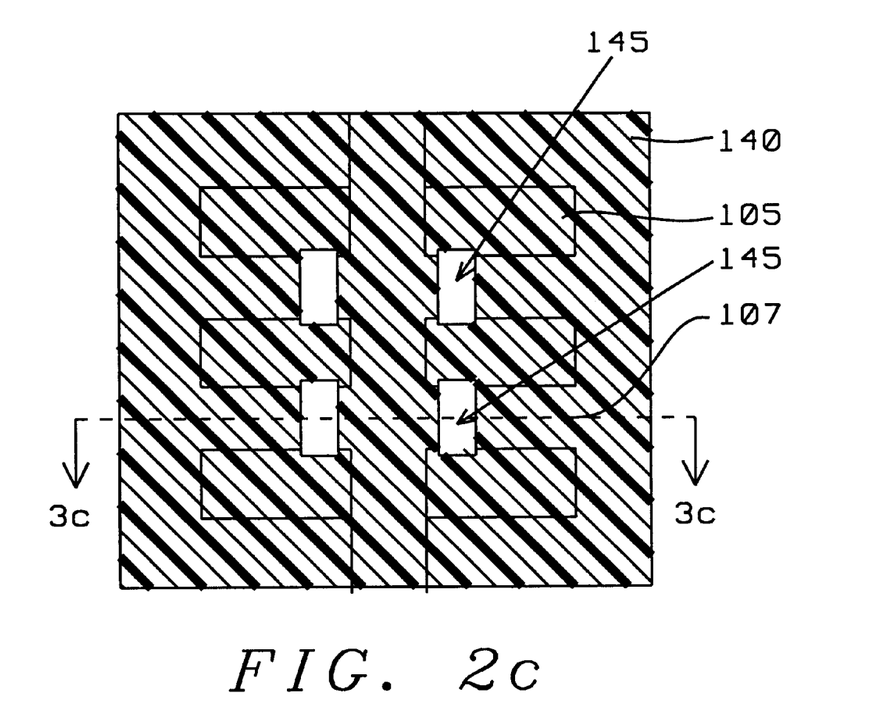
Figure 2D:
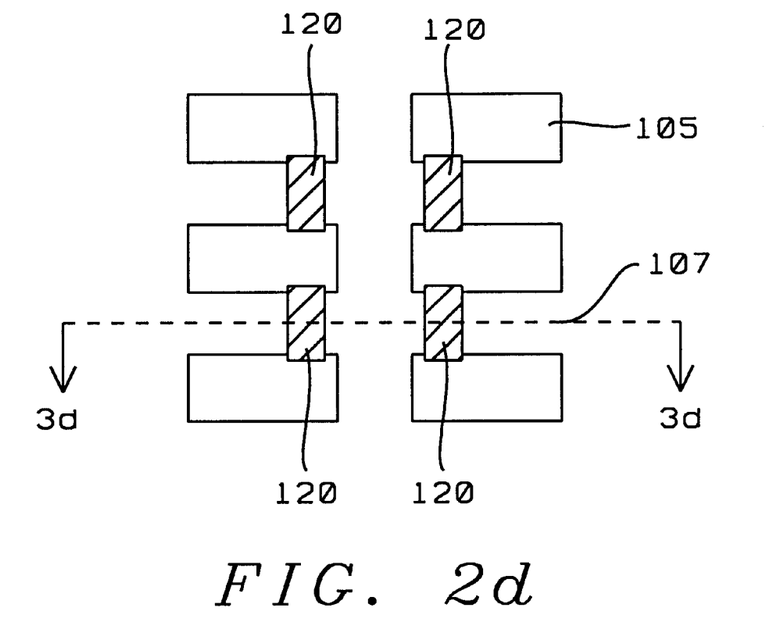
Figure 2E:
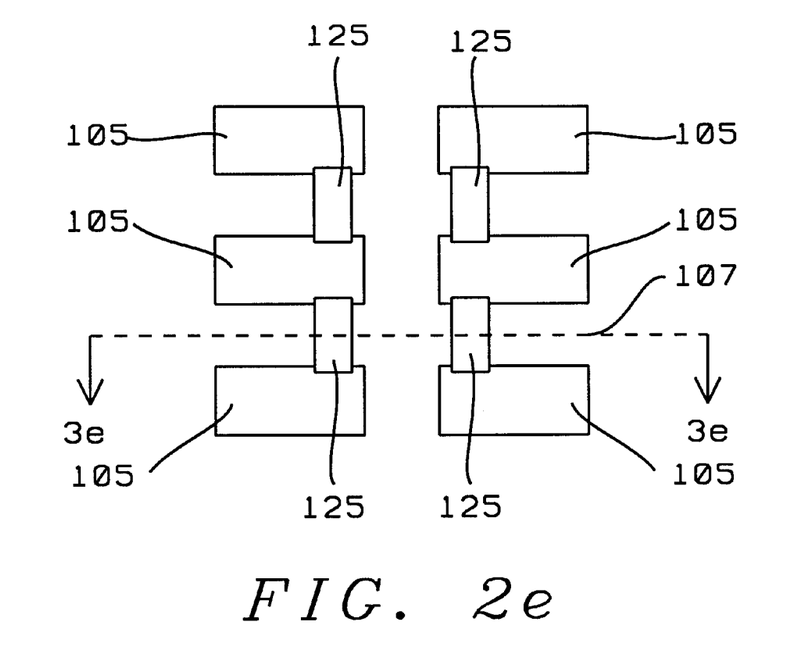
Figure 3B:
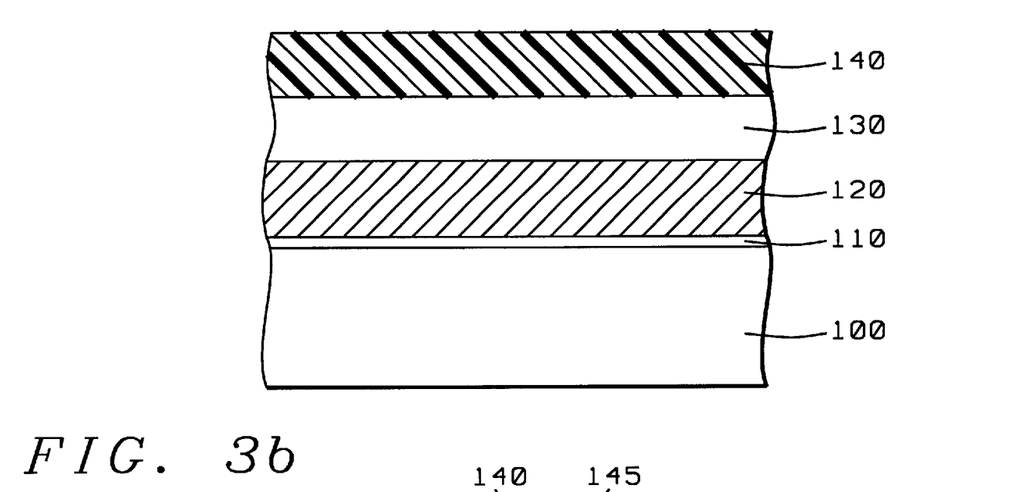
FIG. 3b is a cross-sectional view of the substrate of FIG. 2b showing the forming of a first polysilicon layer, followed by the forming of a nitride layer, and a first photoresist layer, according to the present invention.
Figure 3C:
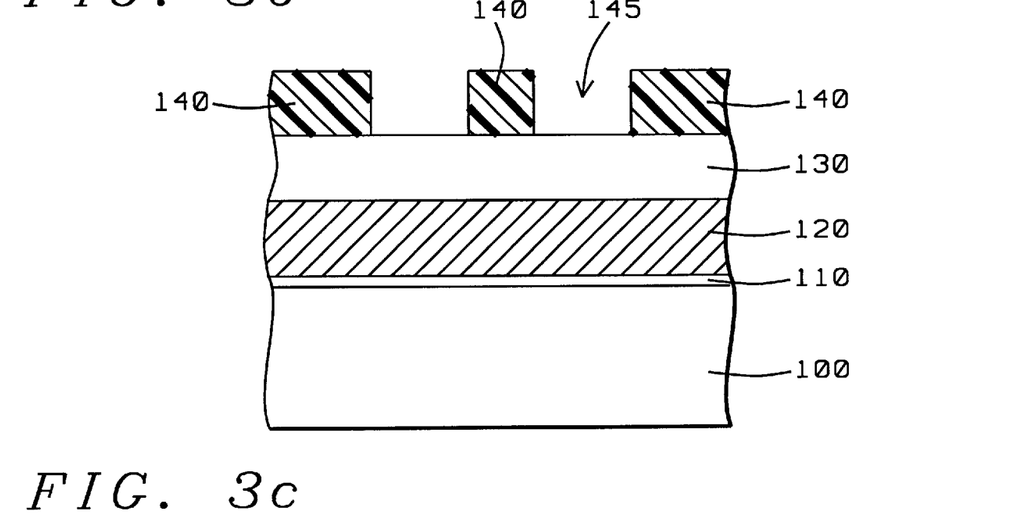
FIG. 3c is a cross-sectional view of the substrate of FIG. 2c showing the patterning of the first photoresist layer, according to the present invention.

Next, first polysilicon layer (120), later to be formed into a floating gate, is deposited over the first gate oxide layer, as shown in FIGS. 2b and 3b. Polysilicon is formed through methods including but not limited to Low Pressure Chemical Vapor Deposition (LPCVD) methods, CVD methods and Physical Vapor Deposition (PVD) sputtering methods employing suitable silicon source materials. It is preferred that LPCVD is used with a silicon source $SiH_4$ at a temperature between about 530 to 650° C. This is followed by forming nitride layer (130) over the first polysilicon layer. It is preferred that nitride layer is formed by CVD at a temperature between about 650 to 800° C. by reacting dichlorosilane ($SiCl_2H_2$) with ammonia ($NH_3$) and to a thickness between about 700 to 900 Å. Then, first photoresist layer (140) is formed and patterned as shown in FIGS. 2b and 3b. Openings (145), where floating gates are defined, can be better seen in the cross-sectional view in FIG. 3c.

Figure 3D:
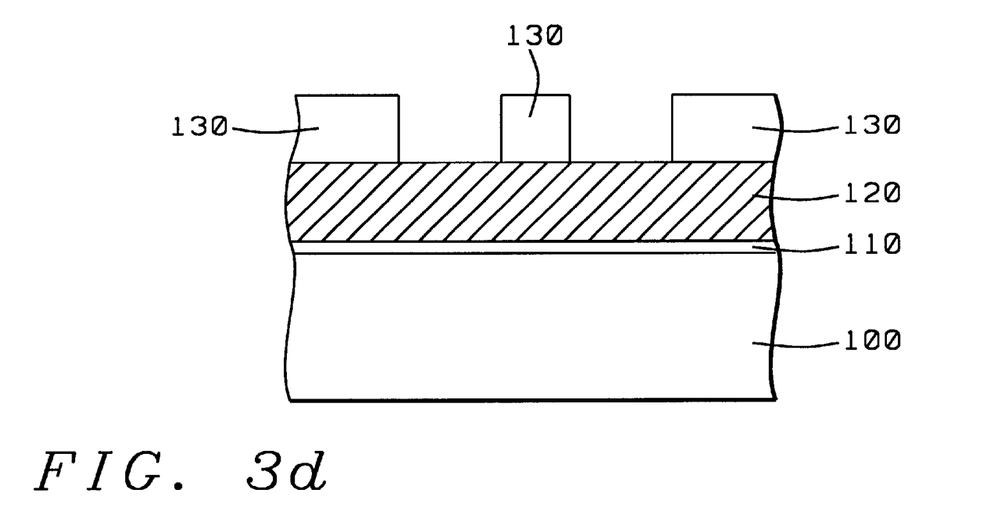
FIG. 3d is a cross-sectional view of the substrate of FIG. 2d showing the patterning of the nitride layer, according to this invention.

Nitride layer (130) is then etched. The etch stops on the polysilicon layer, as shown in FIG. 3d. In the top view in FIG. 2d, portions of the silicon layer that are exposed at the bottom of the etched openings are shown. At the next step photoresist layer (140) is removed.

Figure 3E:
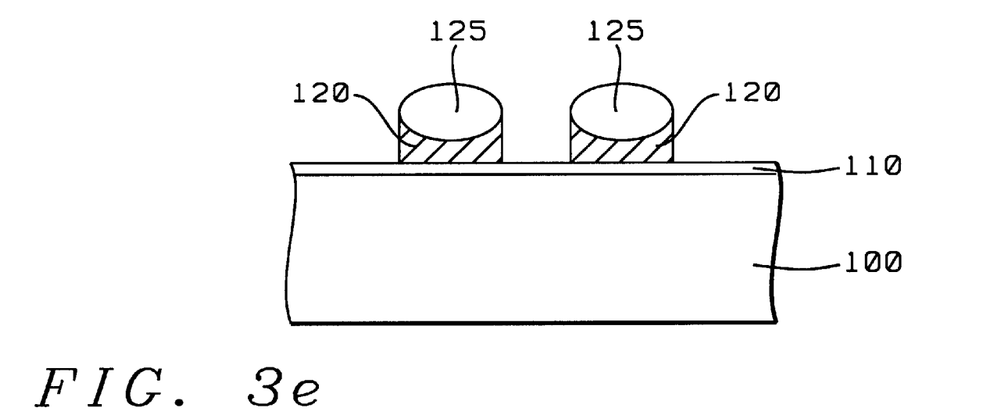
FIG. 3e is a cross-sectional view of the substrate of FIG. 2e showing the forming of the polyoxide caps of the floating gate as well as the floating gate itself, according to the present invention.

Through the patterned openings in the nitride layer, exposed polysilicon is next oxidized using wet-oxidation at a temperature between about 800 to 950° C. The resulting polyoxide layer, or "caps" (125), are shown in FIG. 3e, where the nitride layer is no longer needed and has been wet-stripped in phosphoric acid solution $H_3PO_4$. The polyoxide layer preferably has a thickness between about 1100 to 1300 Å. Using the polyoxide layer as a hard mask, the polysilicon layer is etched, thus forming floating gates (120) which are shown in FIG. 3e, and the overlying "caps" (125) in the top view in FIG. 2e.

Figure 2F:
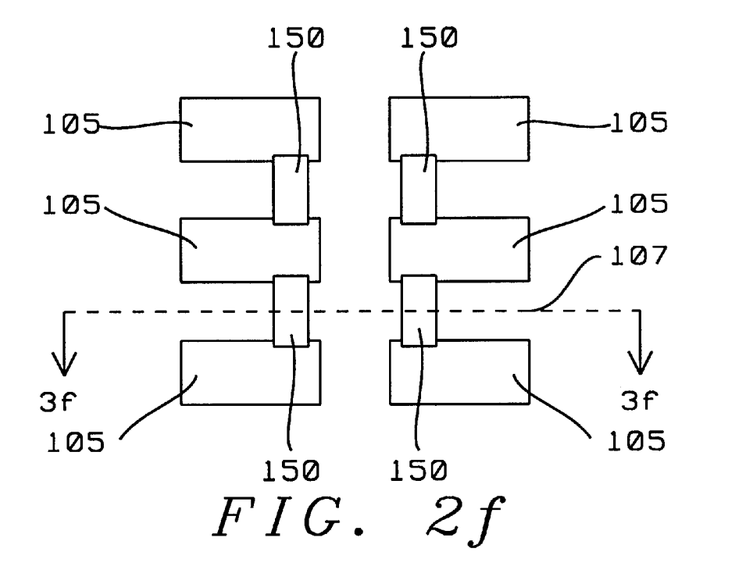
Figure 3F:
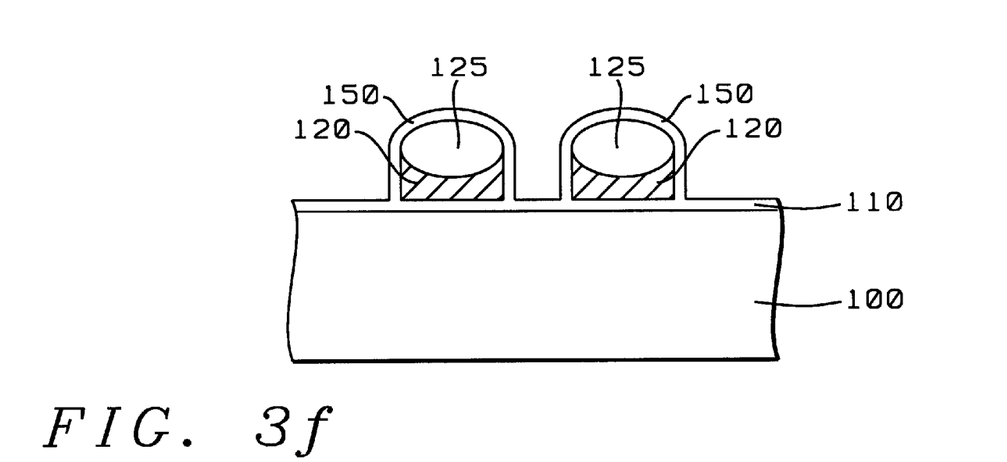
FIG. 3f is a cross-sectional view of the substrate of FIG. 2f showing the forming of an interpoly oxide layer, comprising a layer of high temperature oxide sandwiched between two layers of thermal oxide, according to the present invention.

A composite interpoly oxide layer (150) is next formed over the floating gate as shown in FIG. 3f. The top view is shown in FIG. 2f. The composite layer comprises three layers where the first layer is a first thermal oxide which is thermally grown at a temperature between bout 800 to 950° C., and to a thickness between about 30 to 50 Å. The second layer is a high temperature oxide (HTO), deposited to a thickness between about 120 to 140 Å at a temperature between about 800 to 950° C. And the third layer is a second thermal oxide layer, also grown at the same temperature as the first gate oxide layer, but to a thickness between about between about 60 to 80 Å. The preferred total thickness of interpoly oxide layer (150) in FIG. 3f is thus between about 210 to 270 Å.

Subsequently, using the same process as in forming the first polysilicon layer, a second polysilicon layer (160) is formed over the interpoly oxide layer. Then, following the normal process steps of forming and patterning another photoresist layer (not shown) to define the control gate, and etching the second polysilicon layer to form the control gate, a structure is formed as shown in the cross-sectional view in FIG. 3g. The preferred thickness of the second polysilicon layer is between about 1900 to 2100 Å.

Figure 2G:
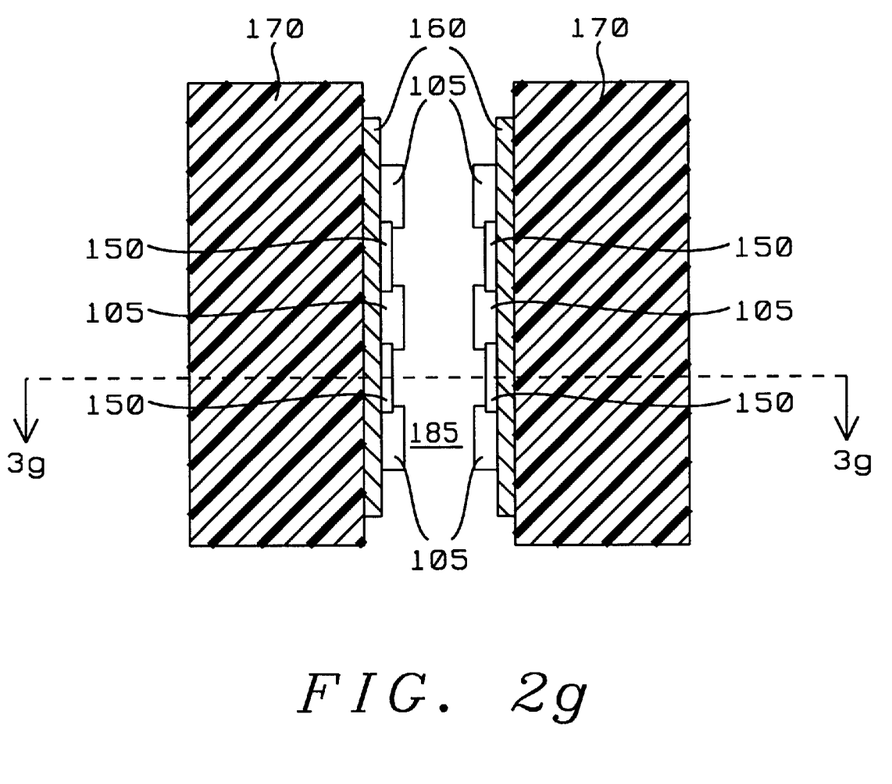
Figure 2H:
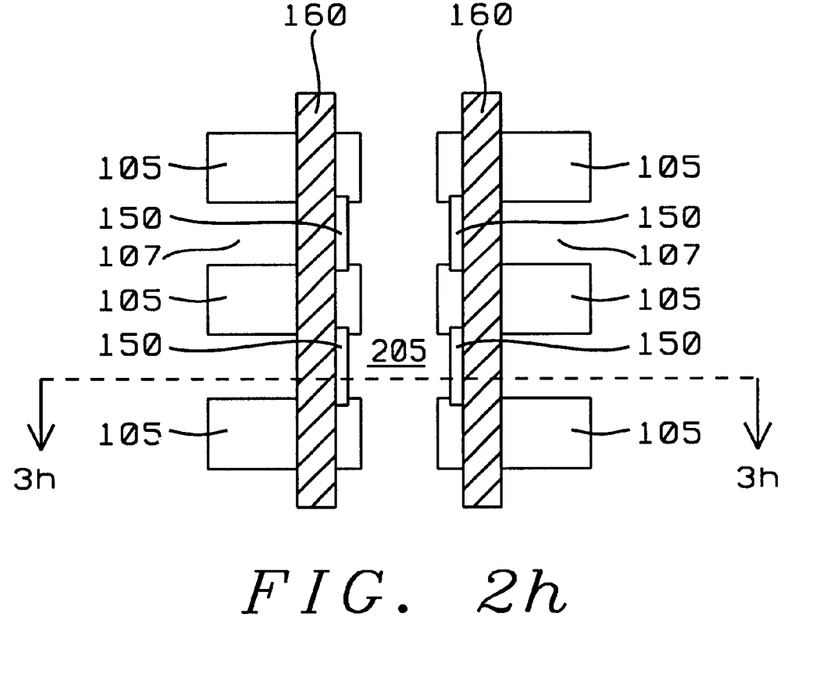
Figure 2I:
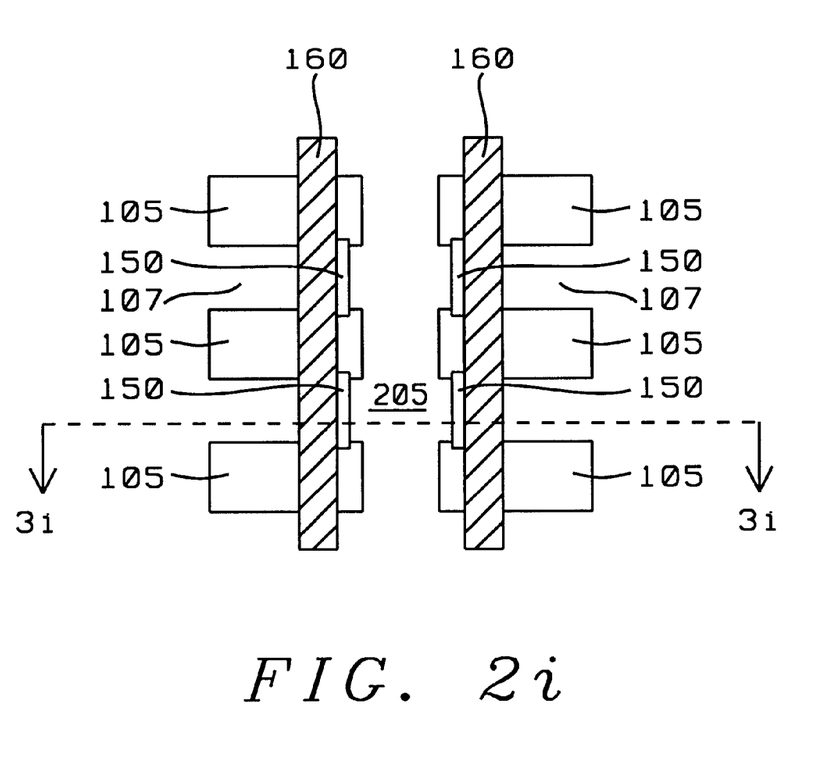
Figure 3G:
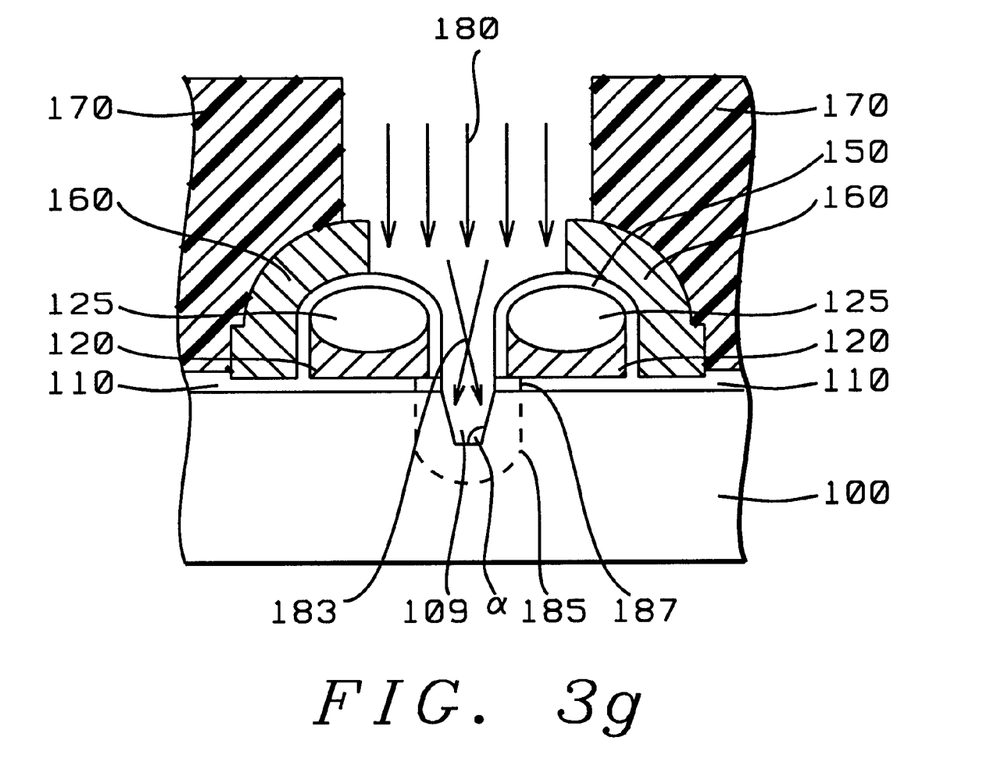
FIG. 3g is a cross-sectional view of the substrate of FIG. 2g showing, after the forming of the control gates, the forming of the trench source of the present invention, with tilted walls.
Figure 3H:
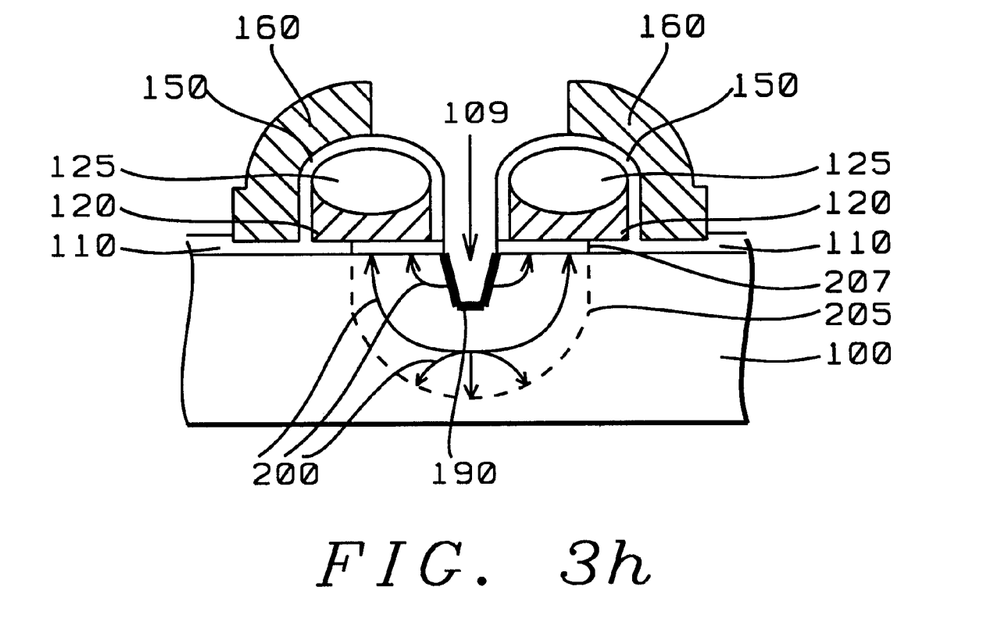
FIG. 3h is a different cross-sectional view of the substrate of FIG. 2h showing the increased lateral diffusion of the trench source of this invention after annealing of the substrate.
Figure 3I:
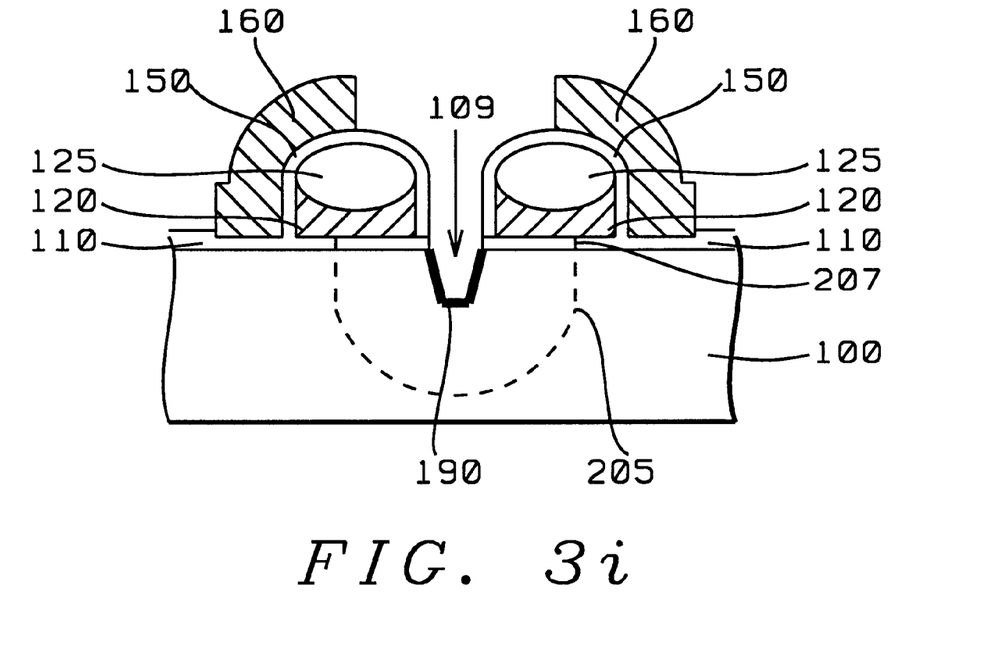
FIG. 3i is an additional cross-sectional view of the substrate of FIG. 2i showing the further increase in the lateral diffusion of the trench source of this invention after thermal cycling of the substrate, thereby increasing the coupling ratio between the source and the floating gate, according to the present invention.

After the removal of the photoresist layer to form the control gates, another second photoresist, layer (170) in FIGS. 2g and 3g, is formed over the control gate to define cell source area. Then, and as a main feature and key aspect of the present invention, the source region is etched to form a trench source. Trench source (109) is also shown in FIG. 3g and has a depth between about 220 to 600 Å. It is important, however, that the trench also has tilted walls with an included angle α between about 10 to 45 degrees. Taking advantage of tilted walls, a source implant is performed at its tilt angle between about 10 to 45 degrees with phosphorous ions at a dosage level between about $1\times10^{15}$ to $1\times10^{16}$ atoms/cm$^2$, and energy between about 10 KeV to 50 KeV. Subsequently, a second thermal oxide, layer (190) in FIG. 3h, is formed over the tilted walls of the trench source. This is accomplished by thermal growth at a temperature between about 800 to 950° C., and to a thickness between about 60 to 80 Å.

It will be noted, however, that although the coupling range (187) of the diffusion area (185) of the trench source, as obtained with the disclosed tilt angles, is wider than the conventional ranges obtained with flat source and implant, it is disclosed here that the range can be improved even further by a subsequent critical step. This involves a further lateral diffusion of implanted ions by annealing the substrate at a temperature between about 800 to 950° C. It is found that the lateral diffusion can be improved even more by subjecting the substrate to thermal cycling as depicted by the reference numeral (200) in FIG. 3h. That is, the range of the newly diffused area (205) spans at least one-half the width of the floating gate, namely, reaching point (207) as shown in both FIGS. 3h and 3i. The cross-sectional views are that of the top views given in FIGS. 2h and 2i. The thermal cycle is accomplished between temperatures about 800 and 950.

Thus, the disclosed tilted trench source provides a higher coupling ratio of source to floating gate with lower implant energy than is possible with conventional flat source cells. This is primarily because of the increased lateral diffusion area of the straggle or stray ions assisted by the tilt angle of both the sidewalls of the trench as well as the tilt angle implant of the source, coupled with annealing and thermal cycling which are believed to be lacking in conventional methods.

While the invention has been particularly shown and described with reference to the preferred embodiments thereof, it will be understood by those skilled in the art that various changes in form and details may be made without departing from the spirit and scope of the invention.

What is claimed is:

1. A method with trench source to increase the coupling of source to floating gate comprising the steps of;
   providing a substrate having a source region;
   forming a split-gate flash memory cell on said substrate, said split-gate flash memory cell having a floating gate;
   then forming a trench source having tilted walls at an angle between about 10 to 45 degrees in said source region;
   performing a source implant at an angle between 10 to 45 degrees;
   forming a trench oxide layer over the inside walls of said trench source;
   performing a lateral diffusion of said source implant; and
   performing thermal cycle of said substrate.

2. The method of claim 1, wherein said substrate is silicon.

3. The method of claim 1, wherein said source implant comprises phosphorous (P) ions at a dosage level between about $1\times10^{15}$ to $1\times10^{16}$ atoms/cm$^2$ and energy between about 10 to 50 KeV.

4. The method of claim 1, wherein said trench oxide layer has a thickness between about 60 to 80 Å.

5. The method of claim 1, wherein said lateral diffusion of said source implant is accomplished at a temperature between about 850 to 950° C.

6. The method of claim 1, wherein said thermal cycle is performed between temperatures about 850 to 950° C.

7. A method with trench source to increase the coupling of source to floating gate comprising the steps of:
   providing a substrate having active and passive regions defined;
   forming a gate oxide layer over said substrate;
   forming a first polysilicon layer over said gate oxide layer;
   forming a nitride layer over said first polysilicon layer;
   patterning said nitride layer to expose a portion of said first polysilicon layer to define a floating gate area;
   performing oxidation of said portion of said first polysilicon layer to form a polyoxide layer over said first polysilicon layer;
   etching said first polysilicon layer using said polyoxide layer as a hard mask to form a floating gate;
   forming an interpoly oxide over said polyoxide;
   forming a second polysilicon layer over said interpoly oxide;

patterning said second polysilicon layer to form a control gate;

then forming a trench source having tilted walls at an angle between about 10 to 45 degrees in said substrate;

performing a source implant at an angle between 10 to 45 degrees;, forming a trench oxide layer over the inside walls of said trench source;

performing a lateral diffusion of said source implant; and performing thermal cycle of said substrate.

8. The method of claim 7, wherein said substrate is silicon.

9. The method of claim 7, wherein said forming said first gate oxide layer is accomplished by thermal growth at a temperature between about 800 to 950° C.

10. The method of claim 7, wherein said gate oxide layer has a thickness between 70 to 90 Å.

11. The method of claim 7, wherein said forming said first polysilicon layer is accomplished with silicon source $SiH_4$ using LPCVD at a temperature between about 530 to 650° C.

12. The method of claim 7, wherein said first polysilicon layer has a thickness between about 900 to 1100 Å.

13. The method of claim 7, wherein said forming said nitride layer over said first polysilicon layer is accomplished by CVD at a temperature between about 650 to 800° C. by reacting dichlorosilane ($SiCl_2H_2$) with ammonia ($NH_3$).

14. The method of claim 7, wherein the thickness of said nitride layer is between about 700 to 900 Å.

15. The method of claim 7, wherein said oxidation of said first polysilicon layer to form poly-oxide is accomplished through thermal oxidation at a temperature between about 800 to 950° C.

16. The method of claim 7, wherein said polyoxide layer has a thickness between about 1100 to 1300 Å.

17. The method of claim 7, wherein said interpoly oxide comprises a layer of first thermal oxide, a layer of high temperature oxide (HTO), and a layer of second thermal oxide.

18. The method of claim 17, wherein said first thermal oxide layer has a thickness between about 30 to 50 Å, and is thermally grown at a temperature between about 800 to 950° C.

19. The method of claim 17, wherein said HTO layer has a thickness between about 120 to 140 Å, and is deposited at a temperature between about 800 to 950° C.

20. The method of claim 17, wherein said second thermal oxide layer has a thickness between about 60 to 80 Å, and is thermally grown at a temperature between about 800 to 950° C.

21. The method of claim 7, wherein said forming said second polysilicon layer is accomplished with silicon source $SiH_4$ using LPCVD at a temperature between about 530 to 650° C.

22. The method of claim 7, wherein said second polysilicon layer has a thickness between about 1900 to 2100 Å.

23. The method of claim 7, wherein said trench source has a depth between about 200 to 600 Å.

24. The method of claim 7, wherein said source implant comprises phosphorous (P) ions at a dosage level between about $1\times10^{15}$ to $1\times10^{16}$ atoms/cm$^2$ and energy between about 10 to 50 KeV.

25. The method of claim 7, wherein said second gate oxide layer is thermally grown at a temperature between about 800 to 950° C.

26. The method of claim 7, wherein said second gate oxide layer has thickness between about 60 to 80 Å.

27. The method of claim 7, wherein said lateral diffusion of said source implant is accomplished at a temperature between about 800 to 950° C.

28. The method of claim 7, wherein said thermal cycle is performed between temperatures about 800 to 950° C.

* * * * *